United States Patent
Li et al.

(10) Patent No.: US 10,731,842 B1
(45) Date of Patent: Aug. 4, 2020

(54) HEAT DISSIPATING BASE AND LIGHT EMITTING DEVICE WITHOUT ADDITIONAL COOLING

(71) Applicant: TRIPLE WIN TECHNOLOGY(SHENZHEN) CO.LTD., Shenzhen (CN)

(72) Inventors: Jin-Hong Li, Shenzhen (CN); Shis-Tao Lai, Shenzhen (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/671,700

(22) Filed: Nov. 1, 2019

(30) Foreign Application Priority Data

Oct. 12, 2019 (CN) .......................... 2019 1 0966215

(51) Int. Cl.
*F21V 29/83* (2015.01)
*H05K 1/02* (2006.01)
*F21Y 115/30* (2016.01)

(52) U.S. Cl.
CPC ........... *F21V 29/83* (2015.01); *H05K 1/0204* (2013.01); *F21Y 2115/30* (2016.08); *H05K 2201/09063* (2013.01)

(58) Field of Classification Search
CPC ................. F21Y 2115/30; F21V 29/83; H05K 2201/09063; H05K 1/0203; H05K 1/0204
See application file for complete search history.

(56) References Cited

U.S. PATENT DOCUMENTS

2008/0013334 A1* 1/2008 Lu .......................... F21V 29/76
362/545

* cited by examiner

*Primary Examiner* — Robert J May
(74) *Attorney, Agent, or Firm* — ScienBiziP, P.C.

(57) ABSTRACT

A heat dissipating base for a light-emitting element sufficient to dissipate generated heat without additional means of dissipating includes a first base plate and a second base plate formed on the first base plate. The first base plate includes first sidewalls. The second base plate includes second sidewalls. The first base plate defines a first groove, the first groove passes through one first sidewall to form a first cutout. The second base plate defines a second groove, the second groove passes through one second sidewall to form a second cutout. The first cutout and the second cutout correspond to each other and cooperatively form a heat dissipating opening. The first groove and the second groove correspond to each other and cooperatively form a channel for dissipating heat. A light emitting device having such heat dissipating base is also provided.

18 Claims, 4 Drawing Sheets

HEAT DISSIPATING BASE AND LIGHT EMITTING DEVICE WITHOUT ADDITIONAL COOLING

FIELD

The subject matter relates to temperature control, and more particularly, to a heat dissipating base and a light emitting device having the heat dissipating base.

BACKGROUND

Light emitting devices may include substrates and vertical cavity surface emitting lasers (VCSELs) mounted on the substrate. The VCSEL generates heat during operation. The heat may be accumulated in the light emitting device if the heat is not dissipated quickly, causing damages to the light emitting device. Thus, a heat sink is usually mounted on the substrate to dissipate the heat. However, a heat sink may increase the production cost.

Therefore, there is room for improvement in the art.

BRIEF DESCRIPTION OF THE DRAWINGS

Implementations of the present technology will now be described, by way of embodiment, with reference to the attached figures.

DETAILED DESCRIPTION

Figure 1:
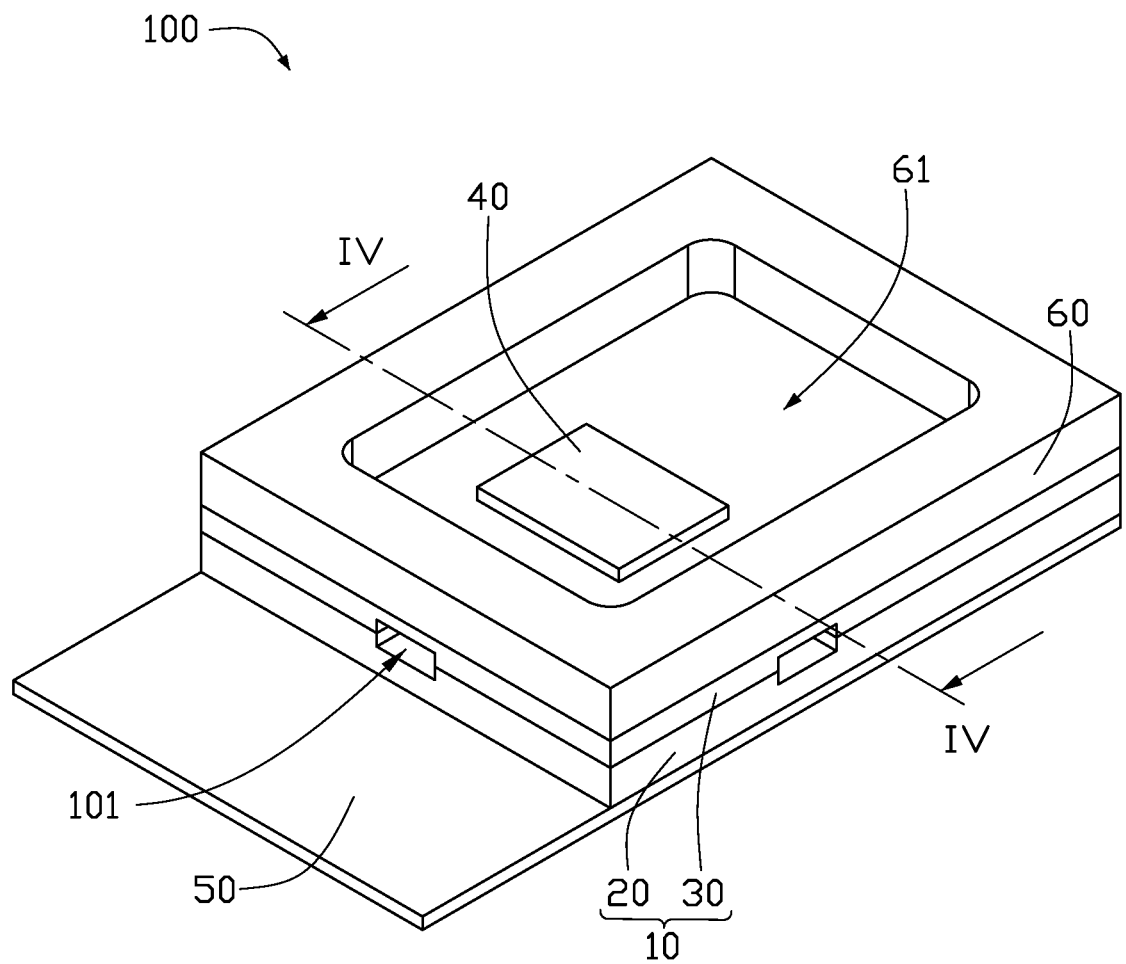
FIG. 1 is a diagrammatic view of an embodiment of a light emitting device according to the present disclosure.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
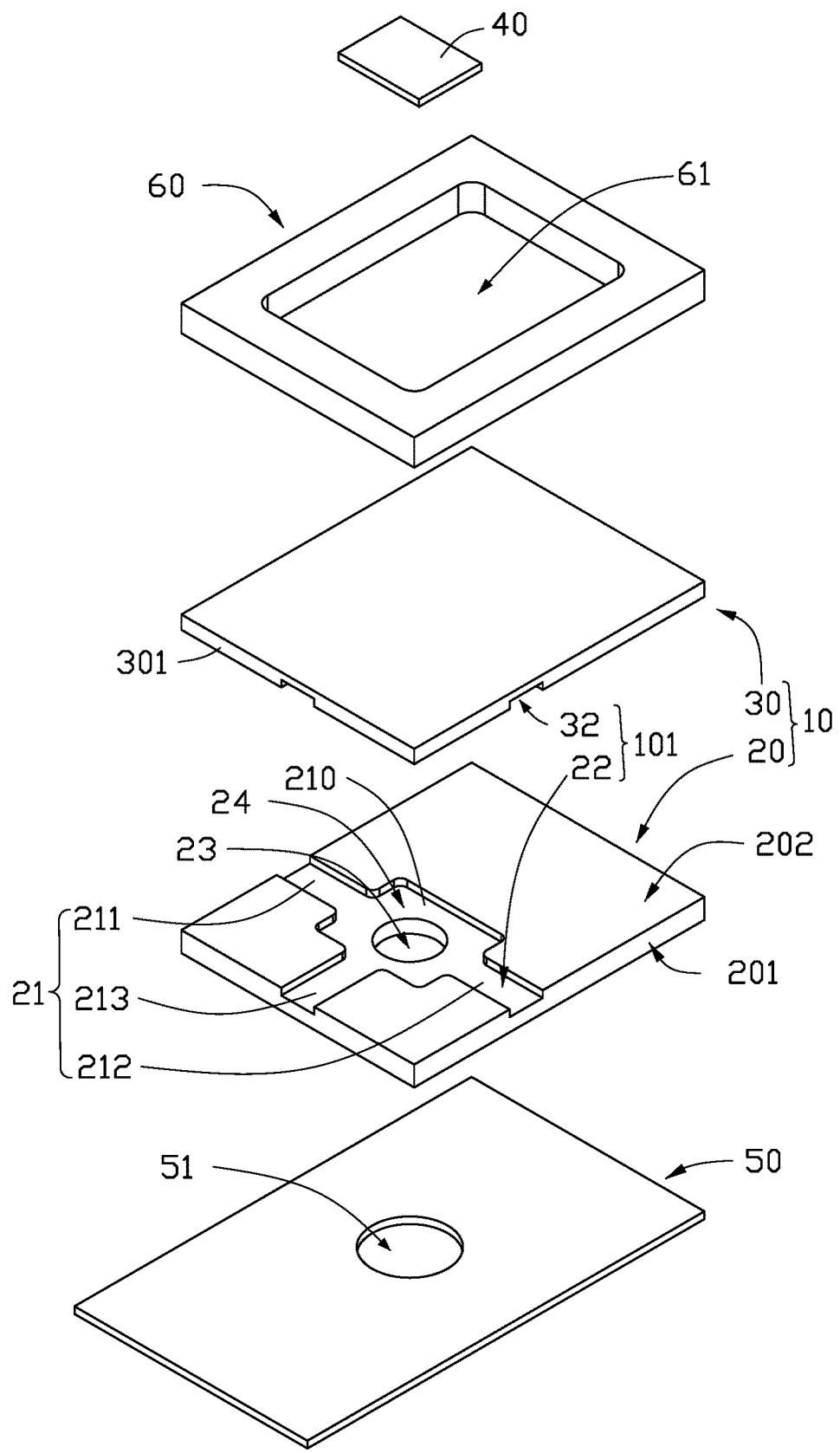
FIG. 2 is an exploded diagram of the light emitting device of FIG. 1.
Figure 3:
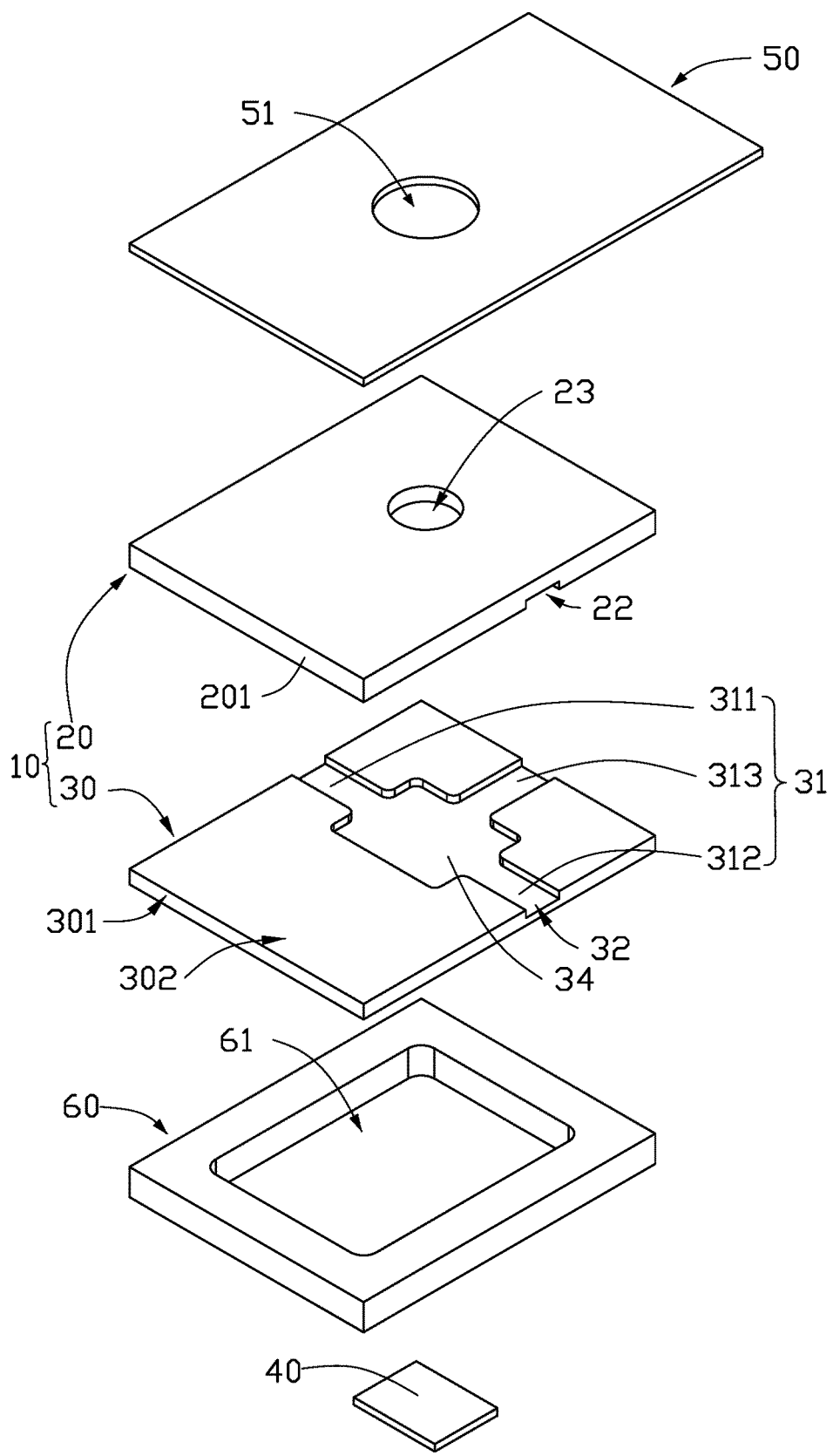
FIG. 3 is an exploded diagram of the light emitting device of FIG. 1, from another angle.

FIGS. 1 to 3 illustrates an embodiment of a light emitting device 100 comprising a heat dissipating base 10, a light source 40, a circuit board 50, and a support bracket 60.

The heat dissipating base 10 comprises a first base plate 20 and a second base plate 30 formed on the first base plate 20.

The first base plate 20 comprises a plurality of first sidewalls 201. In at least one embodiment, the first base plate 20 is substantially rectangular and comprises four first sidewalls 201. The first base plate 20 comprises a first surface 202 facing the second base plate 30. The first base plate 20 defines a first groove 21 at the first surface 202. The first groove 21 passes through at least one first sidewall 201 to form a first cutout 22 at each of the at least one first sidewall 201.

The second base plate 30 is made of a material capable of gathering and dissipating heat, such as aluminum nitride ceramic or a metal. The second base plate comprises a plurality of second sidewalls 301. In at least one embodiment, the second base plate 30 has a shape same as that of the first base plate 20, that is, the second base plate 30 comprises four second sidewalls 301. The second base plate 30 comprises a second surface 302 facing the first base plate 20. The second base plate 30 defines a second groove 31 at the second surface 302. The second groove 31 passes through at least one second sidewall 301 to form a second cutout 32 at each of the at least one second sidewall 301. Each of the first cutout 22 and the second cutout 32 can have a rectangular cross section.

Figure 4:
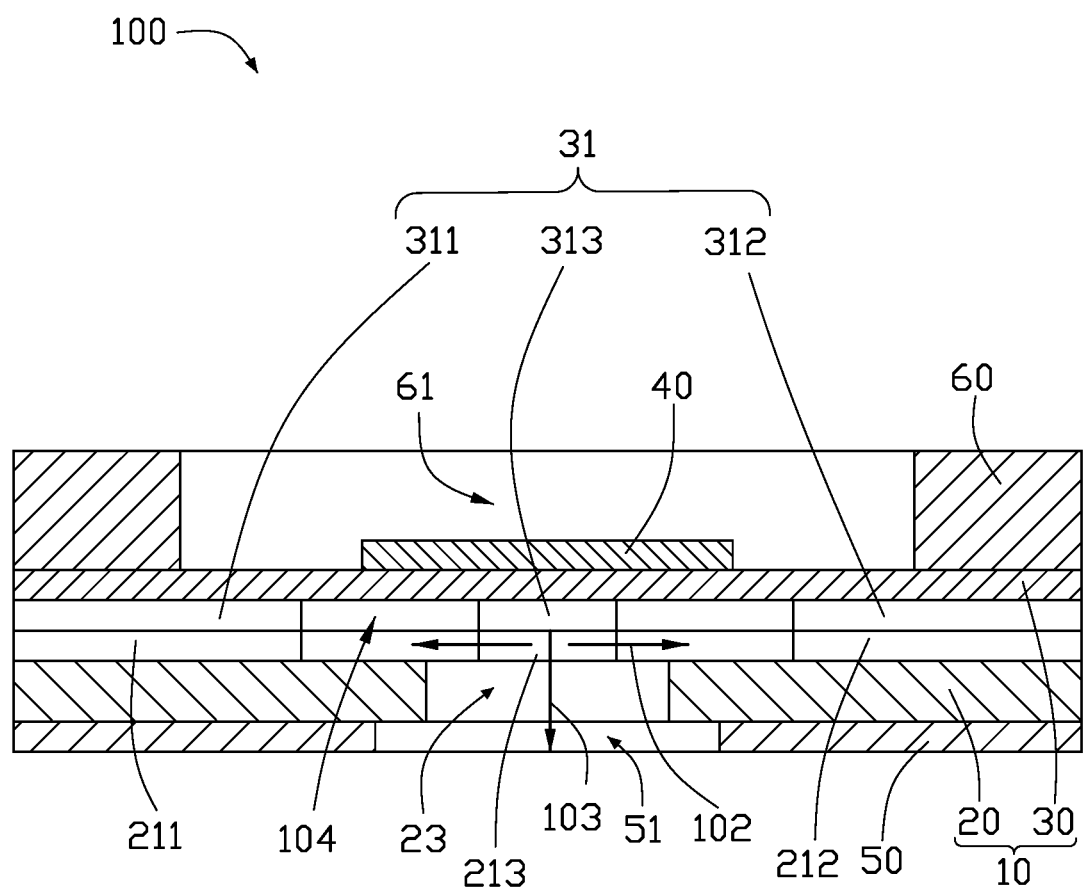
FIG. 4 is a cross-sectional view taken along line IV-IV of FIG. 1.

Referring to FIG. 4, the first cutout 22 and the second cutout 32 correspond to each other and cooperatively form a heat dissipating opening 101. The first groove 21 and the second groove 31 correspond to each other and cooperatively form a first heat dissipating channel 102. The first heat dissipating channel 102 delivers heat from the second base plate 30 to outside environment through the heat dissipating opening 101.

In at least one embodiment, the first groove 21 comprises a bottom surface 210. The first base plate 20 further defines a first through hole 23 at the bottom surface 210. The first through hole 23 forms a second heat dissipating channel 103. The second heat dissipating channel 103 can deliver the heat from the second base plate 30 to the outside environment. In at least one embodiment, the first heat dissipating channel 102 delivers the heat to the outside environment along at least one first direction. The second heat dissipating channel 103 delivers the heat to the outside environment along a second direction. The second direction is perpendicular to each of the at least one first direction. The first through hole 23 can have a circular cross section.

In at least one embodiment, the first groove 21 comprises a first groove portion 211, a second groove portion 212, and a third groove portion 213. Each of the first groove portion 211, the second groove portion 212, and the third groove portion 213 can be straight. The first groove portion 211, the second groove portion 212, and the third groove portion 213 pass through three of first sidewalls 201. Extension lines of the first groove portion 211, the second groove portion 212, and the third groove portion 213 intersect with each other at an intersection point aligned with the first through hole 23. The first groove portion 211 and the second groove portion 212 can be along a same imaginary straight line, and the third groove portion 213 is perpendicular to the first groove portion 211 and the second groove portion 212. The first base plate 20 can also be made of a material capable of dissipating heat, such as aluminum nitride ceramic or metal.

The second groove 31 comprises a fourth groove portion 311 corresponding to the first groove portion 211, a fifth groove portion 312 corresponding to the second groove portion 212, and a sixth groove portion 313 corresponding to the third groove portion 213. Each of the fourth groove portion 311, the fifth groove portion 312, and the sixth groove portion 313 can be straight. The fourth groove portion 311, the fifth groove portion 312, and the sixth groove portion 313 pass through three second sidewalls 301. Extension lines of the fourth groove portion 311, the fifth groove portion 312, and the sixth groove portion 313 intersect with each other at another intersection point aligned with the first through hole 23.

In at least one embodiment, the first base plate 20 further defines a first recess 24 at the first surface 202. The first recess 24 surrounds the intersection point of the first groove portion 211, the second groove portion 212, and the third groove portion 213. The second base plate 30 further defines a second recess 34 at the second surface 302. The second recess 34 surrounds the intersection point of the fourth groove portion 311, the fifth groove portion 312, and the sixth groove portion 313. The second recess 34 and the first recess 24 cooperatively form a heat collecting cavity 104 (shown in FIG. 4) for collecting the heat from the second base plate 30. The heat in the heat collecting cavity 104 can then be dissipated to outside environment by the first heat dissipating channel 102 and the second heat dissipating channel 103. In at least one embodiment, the heat collecting cavity 104 is substantially a hollow cuboid.

The heat dissipating base 10 is mounted on the circuit board 50. The circuit board 50 defines a second through hole 51. The second through hole 51 and the first through hole 23 correspond to each other and cooperatively form the second heat dissipating channel 103. In at least one embodiment, a diameter of the second through hole 51 is greater than a diameter of the first through hole 23.

The support bracket 60 is formed on the second base plate 30, to cause the heat dissipating base 10 to between the support bracket 60 and the circuit board 50. The support bracket 60 is substantially a hollow cuboid. The support bracket 60 defines a receiving space 61. The light source 40 is received in the receiving space 61 and supported by the second base plate 30. The light source 40 generates heat during operation. The heat can be delivered to the second base plate 30, and then dissipated to outside environment by the first heat dissipating channel 102 and the second heat dissipating channel 103. The light source 40 can be a vertical cavity surface emitting laser (VCSEL).

With the above configuration, the first heat dissipating channel 102 can deliver the heat from the second base plate 30 to outside environment through the heat dissipating opening 101. The second heat dissipating channel 103 can deliver the heat from the second base plate 30 to the outside environment. Heat dissipating is substantially improved while no heat sink is needed. Thus, the production cost can be decreased.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A heat dissipating base comprising:
   a first base plate comprising a plurality of first sidewalls; and
   a second base plate formed on the first base plate, the second base plate comprising a plurality of second sidewalls;
   wherein the first base plate comprises a first surface facing the second base plate, the first base plate defines a first groove at the first surface, the first groove passes through at least one of the plurality of first sidewalls to form a first cutout at each of the at least one of the plurality of first sidewalls,
   wherein the second base plate comprises a second surface facing the first base plate, the second base plate defines a second groove at the second surface, the second groove passes through at least one of the plurality of second sidewalls to form a second cutout at each of the at least one of the plurality of second sidewalls, and
   wherein the first cutout and the second cutout correspond to each other and cooperatively form a heat dissipating opening, the first groove and the second groove correspond to each other and cooperatively form a first heat dissipating channel, the first heat dissipating channel is configured to transmit heat from the second base plate to outside environment through the heat dissipating opening.

2. The heat dissipating base of claim 1, wherein the first groove comprises a bottom surface, the first base plate further defines a first through hole at the bottom surface, the first through hole forms a second heat dissipating channel, and the second heat dissipating channel is configured to transmit heat from the second base plate to the outside environment.

3. The heat dissipating base of claim 2, wherein the first heat dissipating channel transmits the heat to the outside environment along at least one first direction, the second heat dissipating channel transmits the heat to the outside environment along a second direction, and the second direction is perpendicular to each of the at least one first direction.

4. The heat dissipating base of claim 2, wherein the first groove comprises a first groove portion, a second groove portion, and a third groove portion, the first groove portion, the second groove portion, and the third groove portion pass through three of the plurality of first sidewalls, extension lines of the first groove portion, the second groove portion, and the third groove portion intersect with each other at an intersection point aligned with the first through hole.

5. The heat dissipating base of claim 4, wherein the first groove portion and the second groove portion are along a same imaginary straight line, and the third groove portion is perpendicular to the first groove portion and the second groove portion.

6. The heat dissipating base of claim 4, wherein the second groove comprises a fourth groove portion corresponding to the first groove portion, a fifth groove portion corresponding to the second groove portion, and a sixth groove portion corresponding to the third groove portion, the fourth groove portion, the fifth groove portion, and the sixth groove portion pass through three of the plurality of second sidewalls, extension lines of the fourth groove portion, the fifth groove portion, and the sixth groove portion intersect with each other at another intersection point aligned with the first through hole.

7. The heat dissipating base of claim 6, wherein the first base plate further defines a first recess at the first surface, the first recess surrounds the intersection point of the first groove portion, the second groove portion, and the third groove portion, the second base plate further defines a second recess at the second surface, the second recess surrounds the intersection point of the fourth groove portion, the fifth groove portion, and the sixth groove portion, the second recess and the first recess cooperatively form a heat collecting cavity for collecting the heat from the second base plate.

8. The heat dissipating base of claim 1, wherein the second base plate is made of aluminum nitride ceramic or metal.

9. A light emitting device comprising:
a light source;
a heat dissipating base comprising:
    a first base plate comprising a plurality of first sidewalls; and
    a second base plate formed on the first base plate, the second base plate comprising a plurality of second sidewalls, the light source positioned on the second base plate and delivered heat to the second base plate;
    wherein the first base plate comprises a first surface facing the second base plate, the first base plate defines a first groove at the first surface, the first groove passes through at least one of the plurality of first sidewalls to form a first cutout at each of the at least one of the plurality of first sidewalls;
    the second base plate comprises a second surface facing the first base plate, the second base plate defines a second groove at the second surface, the second groove passes through at least one of the plurality of second sidewalls to form a second cutout at each of the at least one of the plurality of second sidewalls;
    the first cutout and the second cutout correspond to each other and cooperatively form a heat dissipating opening, the first groove and the second groove correspond to each other and cooperatively form a first heat dissipating channel, the first heat dissipating channel configured to deliver the heat from the second base plate to outside environment through the heat dissipating opening.

10. The heat dissipating base of claim 9, wherein the first groove comprises a bottom surface, the first base plate further defines a first through hole at the bottom surface, the first through hole forms a second heat dissipating channel, and the second heat dissipating channel is configured to deliver the heat from the second base plate to the outside environment.

11. The light emitting device of claim 10, wherein the first heat dissipating channel delivers the heat to the outside environment along at least one first direction, the second heat dissipating channel delivers the heat to the outside environment along a second direction, and the second direction is perpendicular to each of the at least one first direction.

12. The light emitting device of claim 10, wherein the first groove comprises a first groove portion, a second groove portion, and a third groove portion, the first groove portion, the second groove portion, and the third groove portion pass through three of the plurality of first sidewalls, extension lines of the first groove portion, the second groove portion, and the third groove portion intersect with each other at an intersection point aligned with the first through hole.

13. The light emitting device of claim 12, wherein the first groove portion and the second groove portion are along a same imaginary straight line, and the third groove portion is perpendicular to the first groove portion and the second groove portion.

14. The light emitting device of claim 12, wherein the second groove comprises a fourth groove portion corresponding to the first groove portion, a fifth groove portion corresponding to the second groove portion, and a sixth groove portion corresponding to the third groove portion, the fourth groove portion, the fifth groove portion, and the sixth groove portion pass through three of the plurality of second sidewalls, extension lines of the fourth groove portion, the fifth groove portion, and the sixth groove portion intersect with each other at another intersection point aligned with the first through hole.

15. The light emitting device of claim 14, wherein the first base plate further defines a first recess at the first surface, the first recess surrounds the intersection point of the first groove portion, the second groove portion, and the third groove portion, the second base plate further defines a second recess at the second surface, the second recess surrounds the intersection point of the fourth groove portion, the fifth groove portion, and the sixth groove portion, the second recess and the first recess cooperatively form a heat collecting cavity for collecting the heat from the second base plate.

16. The light emitting device of claim 10, further comprising a circuit board, wherein the heat dissipating base is mounted on the circuit board, the circuit board defines a second through hole, the second through hole and the first through hole correspond to each other and cooperatively form the second heat dissipating channel.

17. The light emitting device of claim 16, wherein a diameter of the second through hole is greater than a diameter of the first through hole.

18. The light emitting device of claim 16, further comprises a support bracket formed on the second base plate, the heat dissipating base is positioned between the support bracket and the circuit board, the support bracket defines a receiving space for receiving the light source, and the light source is supported on the second base plate.

* * * * *